INVENTORS
OSCAR J. GROSCH
ROELF DE BOER
BY
Frank R. Jifani
AGENT

INVENTORS
OSCAR J. GROSCH
ROELF DE BOER
BY
Frank R. Trifari
AGENT 3,213,295
Patented Oct. 19, 1965

3,213,295

TRANSISTOR CIRCUITS FOR SWITCHING HIGH CURRENTS THROUGH AN INDUCTIVE LOAD

Oscar Jan Grosch, Cambridge, Mass., and Roelf de Boer, Helden-Panningen, Netherlands, assignors to North American Philips Company, Inc., New York, N.Y., a corporation of Delaware Filed May 4, 1962, Ser. No. 192,521
6 Claims. (Cl. 307—88.5)

This invention relates to transistor circuits for switching high currents through an inductive load, for example the deflection coils of a television display-tube. In such circuits, the currents to be switched through the load can be so high that the transistor may break down if only one is used. If two transistors connected in parallel are used, there is a possibility that upon blocking the transistors, the stored free charge carriers in the base zone of one transistor exceeds that in the other, so that current flows in the former transistor for a longer period of time than in the latter. Since, upon switching off, a rapidly-increasing voltage is set up across the inductive load, the former transistor may become overloaded as a result of unduly high dissipation of power.

According to one aspect of the invention, this problem is obviated in that the emitter-collector paths of two parallel-controlled transistors are connected to the load in series with an equalizing transformer for reducing differences in the currents through the transistors. Further, according to the invention, the primary and secondary windings of the transformer are interconnected on the side of the transistors through a resistor having a low resistance value which, however, exceeds the impedance of the transformer windings.

When using the transformer according to the invention, the currents flowing through the two transistors are equalized to a considerable extent. However, the use of the transformer has a limitation in that the respective voltages produced across the two transistors during the blocking period become different; this incurs the risk that the voltage across one transistor will increase considerably so that the power dissipated therein would become unduly high. The use of the resistor mentioned above obviates this occurrence.

In order that the invention may be readily carried into effect, it will now be described more fully, by way of example, with reference toth e accompanying drawings in which.

Figure 1:
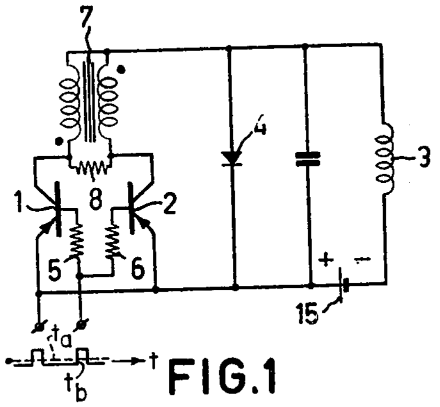
FIG. 1 shows one embodiment in accordance with the invention.

The circuit of FIG. 1 comprises two transistors 1 and 2 by means of which high currents are switched through an inductive load 3, which may be for example the deflection coil of a television display-tube. For this purpose, an input signal voltage which may be in the form of a pulse train as shown is applied to each of the bases of the two transistors, the voltage having a polarity and duration to polarize the bases in the forward direction for a comparatively long period of time and to such a degree that the voltage drop between the emitter and the collector of a transistor becomes substantially zero; the bases are then blocked by the input signal for a comparatively short period of time, so that the transistors 1 and 2 then convey only a minimal current. Thus, a sawtooth current is caused to flow through load 3. Upon interruption, the voltage across load 3 may increase considerably; a so-called efficiency diode 4 may be used to reduce the loss of energy, the diode supplying the excess energy in load inductance 3 back to a supply battery 15. The inductance 3 may have a value of, for example, 100 mh.

As stated above, it is required to switch exceedingly high currents through inductance 3. When a matching transformer is arranged between inductance 3 and the transistors 1 and 2, the current flowing towards the deflection coils may be increased but a higher voltage is then produced across inductance 3. In practice, a value of at least 2,000 v.a. for the product of the peak values of the voltage across and the current through the load should be designed for. Since the voltage across a transistor is restricted to a given maximum, one transistor together with a diode generally cannot supply the required current. The two transistors 1 and 2 are, therefore, connected in parallel so that together they can supply the required current.

This parallel connection produces several problems. Firstly, the base input impedance of a transistor exhibits a certain stray component; this can be eliminated with the aid of series-resistors 5 and 6 included between the control voltage source and the bases of the transistors and having a value of, for example, 1 ohm each. But even when the resistors 5 and 6 are provided to insure that the base currents of the transistors have approximately equal value during the conducting period of the transistors, it is not certain that the collector currents will have equal values. However, since the voltage between the collector and the emitter of a transistor is substantially zero during this period, the dissipation in the transistors is also small, so that it is sufficient if the collector currents do not differ greatly from each other. The risk of overloading is considerably increased at the moment when the transistors are cut off by means of the control voltage. The amount of free charge carriers stored in the base zone of one transistor may differ greatly from that in the other transistor. The former transistor will then be conducting whereas the latter will have already been cut off. The current now has to be supplied to the load 3 by the conducting transistor thus increasing greatly the load on this transistor.

Figure 2:
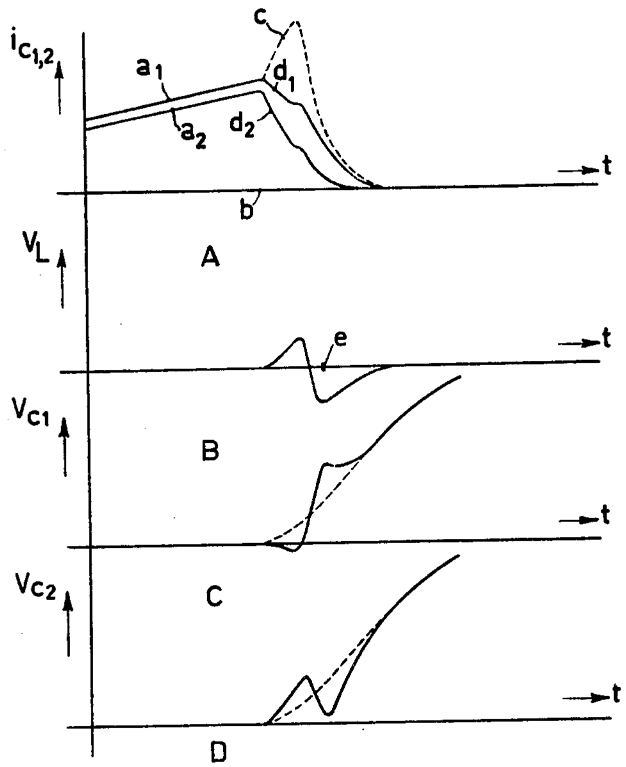
FIG. 2 shows current- and voltage-time diagrams for further explanation of FIG. 1, and FIGS. 3 and 4 show two further embodiments of the invention.

In FIG. 2A, lines $a_1$ and $a_2$ indicate the collector currents $I_{c1}$ and $I_{c2}$ of the transistors 1 and 2 respectively, as a function of the time $t$; these currents flow during the conducting periods (indicated by $t_a$ in FIG. 1). Transistor 1, for example, has the greatest storage of charge carriers at the moment $b$ (indicated by $t_b$ in FIG. 1) when the polarity of the control voltage is reversed and this voltage acts to cut off the transistors, so that a current according to the curve $c$ will flow through this transistor as a result of the voltage pulse produced across load 3.

According to the invention, in order to prevent undesired differences in current use is made of an equalizing transformer 7 connected in series with the load and the transistors 1 and 2. Such a transformer generally has a winding ratio 1:1. The winding sense is such that the voltage at the collector of transistor 1 is decreased while the voltage at the collector of transistor 2 is increased, so that differences in the currents through the two windings are reduced. It is, thus ensured that the current variation of the transistors has a waveform approximately as indicated by the curves $a_1$–$d_1$ and $a_2$–$d_2$, respectively.

The transformer 7 may be extremely small. The inductance of each winding may be, for example, about 3 $\mu$h. at a control frequency of, for example, 15 kc./s. Consequently the influence exerted by transformer 7 on the conducting period is comparatively small. FIG. 2B represents the voltage across transformer 7. In the absence of transformer 7 the collector voltage $V_{c1}$ of transistor 1 would correspond to the dotted line in FIG. 2C and the collector voltage $V_{c2}$ of the transistor 2 would correspond to the dotted line in FIG. 2D. The presence of transformer 7 ensures that the voltage $V_{c1}$ corresponds to the full line in FIG. 2C and the voltage $V_{c2}$ corresponds to the full line in FIG. 2D.

The transformer 7 must be so small that it can rapidly prevent the sudden increase in current *c* shown in FIG. 2A. As a result, however, a decay phenomenon occurs, so that at the moment *e*, the polarity of the voltage $V_L$ across transformer 7 is reversed and thus the voltage $V_{c1}$ is raised and the voltage $V_{c2}$ is reduced. At the moment *e* however, the storage of free charge carriers in transistor 1 is not negligible, so that increased dissipation (product of $I_{c1}$ and $V_{c1}$) occurs in transistor 1. According to a further characteristic of the invention, the increased dissipation is reduced by means of a resistor 8.

Resistor 8 is connected between the primary and secondary windings of transistor 7 at the ends of these windings which are connected to the transistors 1 and 2, respectively. It has a value low enough so that the above-mentioned oscillating phenomenon is damped to a considerable extent. The value of resistor 8 must, however, exceed the impedance of the windings of transformer 7 since otherwise the desired effect of equalization would not be obtained. A suitable value for resistor 8 in the above example is 4.7 ohms. When this step is taken, the current $d_1$ in FIG. 2A decreases a little less rapidly, but this is offset by the fact that the voltage across transformer 7 exhibits no further substantial decay so that the voltage $V_{c1}$ at the moment *e* becomes sufficiently low to obviate any possible harm to the transistor.

The transistor to be used is preferably a junction transistor. A suitable type for use in the arrangement shown would have, for example, a maximum permissible collector current of 10 amps. and a maximum permissible collector voltage of 120 volts. Consequently, the transistors can switch a power of $2\times120$ v.$\times10$ a.=2,400 v.a., which may be increased by using the diode 4 by an amount of 1,000 v.a. Use may also be made of so-called controlled semi-conductor rectifiers.

Figure 3:
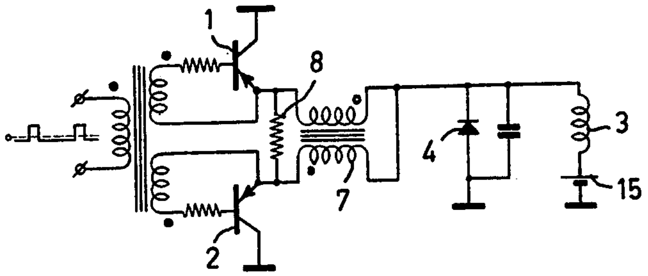
Figure 4:
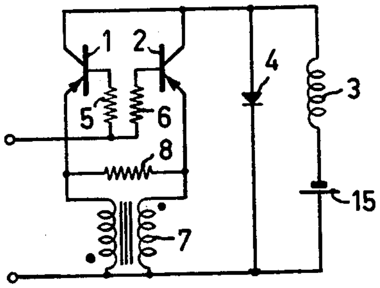

The transformer 7 is active mainly at the beginning of the period during which the transistors 1 and 2 are cut off. Consequently, the same result as that described above may be obtained if the transformer 7 and resistor 8 are included in the emitter circuits of the transistors, as is shown in the embodiments of FIGS. 3 and 4, respectively. The operation of the circuits shown in FIGS. 3 and 4 is in all other respects similar to that of FIG. 1.

It will be evident that the circuit shown is suitable for switching high currents through any inductive load. Thus the circuit may be used, for example, for control of electric motors. Other modifications and variations will also be apparent to those skilled in the art without departing from the inventive concept, the scope of which is set forth in the appended claims.

What is claimed is:

1. A transistor circuit for switching high currents through an inductive load, comprising: two semi-conductive devices, each having a control electrode, two main electrodes and a main current path, a transformer having a primary and a secondary winding, one end of said primary and secondary windings being connected together and coupled to one end of an inductive load, the other end of the inductive load being coupled to corresponding main electrodes of the devices, the other corresponding main electrodes of the devices being connected to the other ends of said primary and secondary windings respectively, means for applying a pulse train simultaneously to both control electrodes, said pulse train rendering both of said devices simultaneously conductive for a relatively long period of time and simultaneously blocking said devices for a relatively short period of time, the winding sense of the transformer windings being such that the voltage at the other corresponding main electrode of one device decreases when the voltage at the other corresponding main electrode of the other device increases, whereby the main current paths of the both devices are in series with the transformer and the load for equalizing differences in currents flowing through the transistors.

2. A transistor circuit as recited in claim 1, wherein said other ends of the transformer windings are interconnected by a resistor having a resistance value greater than the impedance of the transformer windings.

3. A transistor circuit for switching high currents through an inductive load, comprising: two transistors, each having emitter, base and collector electrodes and an emitter-collector path, the emitter electrodes being coupled together, a transformer having a primary winding and a secondary winding, one end of said primary and secondary windings being connected together and to one end of an inductive load, the other end of the inductive load being coupled to the emitter electrodes, the other end of the primary winding being connected to the collector electrode of one transistor, the other end of the secondary winding being connected to the collector electrode of the other transistor, means for applying a pulse train simultaneously to both base electrodes, said pulse train rendering both of said transistors simultaneously conductive for a relatively long period of time and simultaneously blocking said transistors for a relatively short period of time, the winding sense of the transformer windings being such that the voltage at the collector of one transistor decreases when the voltage at the collector of the other transistor increases, whereby the emitter-collector paths of the transistors are in parallel with each other and in series with the transformer and the load for equalizing differences in currents flowing through the transistors.

4. A transistor circuit for switching high currents through an inductive load, comprising: two transistors, each having emitter, base and collector electrodes and an emitter-collector path, the emitter electrodes being coupled together, a transformer having a primary winding and a secondary winding, one end of said primary and secondary windings being connected together and to one end of an inductive load, the other end of the inductive load being coupled to the emitter electrodes, the other end of the primary winding being connected to the collector electrode of one transistor, the other end of the secondary winding being connected to the collector electrode of the other transistor, said other winding ends being interconnected by a resistor having a resistance value greater than the impedance of the transformer windings, means for applying a pulse train simultaneously to both base electrodes, said pulse train rendering both of said transistors simultaneously conductive for a relative long period of time and simultaneously blocking said transistors for a relatively short period of time, the winding sense of the transformer windings being such that the voltage at the collector of one transistor decreases when the voltage at the collector of the other transistor increases, whereby the emitter-collector paths of the transistors are in parallel with each other and in series with the transformer and the load for equalizing differences in currents through the transistors.

5. A transistor circuit for switching high currents through an inductive load, comprising: two transistors, each having emitter, base and collector electrodes and an emitter-collector path, the collector electrodes being coupled together, a transformer having a primary winding and a secondary winding, one end of said primary and secondary windings being connected together and to one end of an inductive load, the other end of the inductive load being coupled to the collector electrodes, the other end of the primary winding being connected to the emitter electrode of one transistor, the other end of the secondary winding being connected to the emitter electrode of the other transistor, means for applying a pulse train simultaneously to both base electrodes, said pulse train rendering both of said transistors simultaneously conductive for a relatively long period of time and simultaneously blocking said transistors for a relatively short period of time, the winding sense of the transformer windings being such that the voltage at the collector of one transistor decreases when the voltage at the collector of the other transistor increases, whereby the emitter-collector paths of the transistors are in parallel with each other and in series with the transformer and the load for equalizing differences in currents through the transistors.

6. A transistor circuit for switching high currents through an inductive load, comprising: two transistors, each having emitter, base and collector electrodes and an emitter-collector path, the collector electrodes being coupled together, a transformer having a primary winding and a secondary winding, one end of said primary and secondary windings being connected together and to one end of an inductive load, the other end of the inductive load being coupled to the collector electrodes, the other end of the primary winding being connected to the emitter electrode of one transistor, the other end of the secondary winding being connected to the emitter electrode of the other transistor, means for applying a pulse train simultaneously to both base electrodes, said pulse train rendering both of said transistors simultaneously conductive for a relatively long period of time and simultaneously blocking said transistors for a relatively short period of time, said other winding ends being interconnected by a resistor having a resistance value greater than the impedance of the transformer windings, the winding sense of the transformer windings being such that the voltage at the collector of one transistor decreases when the voltage at the collector of the other transistor increases, whereby the emitter-collector paths of the transistors are in parallel with each other and in series with the transformer and the load for equalizing differences in currents through the transistors.

References Cited by the Examiner

UNITED STATES PATENTS 3,075,084 1/63 De Miranda et al. ------ 328—39.5

JOHN W. HUCKERT, *Primary Examiner.*

DAVID J. GALVIN, *Examiner.*